US010416909B2

(12) United States Patent
Bedeschi et al.

(10) Patent No.: US 10,416,909 B2
(45) Date of Patent: *Sep. 17, 2019

(54) METHODS FOR PHASE-CHANGE MEMORY ARRAY

(71) Applicant: Micron Technology, Inc., Boise, ID (US)

(72) Inventors: Ferdinando Bedeschi, Biassono (IT); Claudio Resta, Pavia (IT); Marco Ferraro, Lecce (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/253,087

(22) Filed: Jan. 21, 2019

(65) Prior Publication Data
US 2019/0155528 A1    May 23, 2019

Related U.S. Application Data

(63) Continuation of application No. 15/827,795, filed on Nov. 30, 2017, now Pat. No. 10,216,438, which is a
(Continued)

(51) Int. Cl.
*G06F 3/06* (2006.01)
*H01L 45/00* (2006.01)
(Continued)

(52) U.S. Cl.
CPC .......... *G06F 3/0622* (2013.01); *G06F 3/0643* (2013.01); *G06F 3/0679* (2013.01);
(Continued)

(58) Field of Classification Search
CPC .... G06F 3/0622; G06F 3/0643; G06F 3/0679; G11C 13/0004; G11C 13/004;
(Continued)

(56) References Cited

U.S. PATENT DOCUMENTS 5,594,793 A     1/1997  Bahout
6,141,241 A    10/2000  Ovshinsky et al.
(Continued)

FOREIGN PATENT DOCUMENTS

CN    101290969 A    10/2008
CN    103222005 A     7/2013
(Continued)

OTHER PUBLICATIONS

U.S. Appl. No. 13/518,361, Non Final Office Action dated Feb. 25, 2015, 17 pgs.
(Continued)

*Primary Examiner* — Fernando Hidalgo
(74) *Attorney, Agent, or Firm* — Schwegman Lundberg & Woessner, P.A.

(57) ABSTRACT

Methods of operating phase-change memory arrays are described. A method includes determining a pattern to be written to a phase-change memory array and executing, according to the pattern, two or more proper reset sequences on the phase-change memory array to write the pattern to the phase-change memory array. Another method includes executing a set sequence on a phase-change memory array and performing a proper read of the phase-change memory array to obtain a pattern derived from executing the set sequence.

18 Claims, 7 Drawing Sheets

Related U.S. Application Data continuation of application No. 15/012,478, filed on Feb. 1, 2016, now Pat. No. 9,851,913, which is a continuation of application No. 13/518,361, filed as application No. PCT/IT2009/000603 on Dec. 31, 2009, now Pat. No. 9,251,897.

(51) Int. Cl.
  *G11C 13/00* (2006.01)
  *G11C 13/02* (2006.01)
(52) U.S. Cl.
  CPC ........ *G11C 13/0004* (2013.01); *G11C 13/004* (2013.01); *G11C 13/0059* (2013.01); *G11C 13/0069* (2013.01); *G11C 13/0097* (2013.01); *G11C 13/02* (2013.01); *H01L 45/06* (2013.01); *H01L 45/04* (2013.01)
(58) Field of Classification Search
  CPC ............ G11C 13/0059; G11C 13/0069; G11C 13/0097; G11C 13/02; H01L 45/06; H01L 45/04
  USPC ... 365/163, 189.011, 189.15, 189.16, 189.09
  See application file for complete search history.

(56) References Cited

U.S. PATENT DOCUMENTS

| | | | |
|---|---|---|---|
| 7,885,121 B2* | 2/2011 | Takase | G11C 13/0007 365/148 |
| 7,962,361 B2 | 6/2011 | Ramchandani et al. | |
| 8,809,829 B2* | 8/2014 | Lee | H01L 45/06 257/2 |
| 9,251,897 B2 | 2/2016 | Bedeschi et al. | |
| 9,851,913 B2 | 12/2017 | Bedeschi et al. | |
| 2004/0095825 A1 | 5/2004 | Tanizaki et al. | |
| 2005/0213367 A1 | 9/2005 | Li et al. | |
| 2006/0007729 A1 | 1/2006 | Cho et al. | |
| 2006/0056227 A1* | 3/2006 | Parkinson | G11C 13/0004 365/148 |
| 2007/0114510 A1 | 5/2007 | Sato et al. | |
| 2007/0171730 A1* | 7/2007 | Ramamoorthy | G06F 11/1068 365/185.33 |
| 2007/0217559 A1 | 9/2007 | Stott et al. | |
| 2008/0177922 A1 | 7/2008 | Chow et al. | |
| 2008/0252459 A1 | 10/2008 | Butler et al. | |
| 2009/0059658 A1 | 3/2009 | Cho et al. | |
| 2009/0073768 A1 | 3/2009 | Oh et al. | |
| 2009/0141546 A1 | 6/2009 | Kim et al. | |
| 2009/0225588 A1 | 9/2009 | Czubatyj et al. | |
| 2009/0273970 A1* | 11/2009 | Fuji | G11C 11/406 365/163 |
| 2009/0296458 A1 | 12/2009 | Lee et al. | |
| 2010/0165725 A1 | 7/2010 | Bedeschi | |
| 2010/0226168 A1 | 9/2010 | Savransky | |
| 2010/0246287 A1* | 9/2010 | Vigoda | G11C 7/1006 365/189.15 |
| 2010/0317371 A1 | 12/2010 | Westerinen | |
| 2011/0010422 A1 | 1/2011 | Bezancon et al. | |
| 2011/0093340 A1 | 4/2011 | Kramer et al. | |
| 2011/0167125 A1 | 7/2011 | Achlioptas | |
| 2011/0184945 A1 | 7/2011 | Das et al. | |
| 2011/0307167 A1 | 12/2011 | Taschereau | |
| 2014/0376306 A1 | 12/2014 | Bedeschi et al. | |
| 2016/0162213 A1 | 6/2016 | Bedeschi et al. | |
| 2018/0095687 A1 | 4/2018 | Bedeschi et al. | |

FOREIGN PATENT DOCUMENTS

| | | |
|---|---|---|
| CN | 103222005 B | 8/2016 |
| DE | 112009005490 T5 | 1/2013 |
| EP | 0651394 A1 | 5/1995 |
| JP | 2008217963 A | 9/2008 |
| JP | 20113235 A | 1/2011 |

OTHER PUBLICATIONS

U.S. Appl. No. 13/518,361, Response filed May 22, 2015 to Non Final Office Action dated Feb. 25, 2015, 12 pgs.
U.S. Appl. No. 13/518,361, Notice of Allowance dated Jun. 5, 2015, 7 pgs.
U.S. Appl. No. 13/518,361, Notice of Allowance dated Sep. 21, 2015, 5 pgs.
U.S. Appl. No. 155/012,478, Preliminary Amendment filed Feb. 22, 2016, 9 pgs.
U.S. Appl. No. 15/012,478, Non Final Office Action dated Sep. 28, 2016, 10 pgs.
U.S. Appl. No. 15/012,478, Response filed Dec. 28, 2016 to Non Final Office Action dated Sep. 28, 2016, 12 pgs.
U.S. Appl. No. 15/012,478, Non Final Office Action dated Feb. 14, 2017, 27 pgs.
U.S. Appl. No. 15/012,478, Response filed Jun. 14, 2017 to Non Final Office Action dated Feb. 14, 2017, 10 pgs.
U.S. Appl. No. 15/012,478, Notice of Allowance dated Aug. 23, 2017, 10 pgs.
U.S. Appl. No. 15/012,478, Notice of Allowability dated Sep. 7, 2017, 5 pgs.
U.S. Appl. No. 15/827,795, Preliminary Amendment filed Dec. 15, 2017, 8 pgs.
U.S. Appl. No. 15/827,795, Non Final Office Action dated May 3, 2018, 10 pgs.
U.S. Appl. No. 15/827,795, Response filed Aug. 3, 2018 to Non-Final Office Action dated May 3, 2018, 9 pgs.
U.S. Appl. No. 15/827,795, Notice of Allowance dated Oct. 11, 2018, 11 pgs.
"Chinese Application Serial No. 200980163406.9, Office Action dated Jun. 2, 2015", 6 pgs.
"Chinese Application Serial No. 200980163406.9, Office Action dated Oct. 11, 2014", W/ English Translation, 14 pgs.
"Chinese Application Serial No. 200980163406.9, Office Action dated Nov. 20, 2015", w/English Translation, 8 pgs.
"Chinese Application Serial No. 200980163406.9, Response filed Mar. 31, 2016 to Office Action dated Nov. 20, 2015", (English Translation of Claims), 12 pgs.
"Dual Media Optical Disk", IBM Technical Disclosure Bulletin, (Nov. 1994), 3 pgs.
"International Application Serial No. PCT/IT2009/000603, International Preliminary Report on Patentability Jul. 4, 2012", 6 pgs.
"International Application Serial No. PCT/IT2009/000603, International Search Report Feb. 6, 2010", 3 pgs.
"International Application Serial. No. PCT/IT2009/000603, Written Opinion dated Feb. 6, 2010", 5 pgs.
"Japanese Application Serial No. 2012-546563, Office Action dated Oct. 1, 2013", W/ English Translation, 13 pgs.
"Japanese Application Serial No. 2012-546563, Response filed Dec. 25, 2013 to Office Action dated Oct. 1, 2013", W/ English Claims, 17 pgs.
"Korean Application Serial No. 10-2012-7019823 Response filed Mar. 10, 2015 to Office Action dated Jan. 16, 2015", With the English claims, 18 pgs.
"Korean Application Serial No. 10-2012-7019823, Office Action dated Jan. 16, 2015", W/ English Translation, 7 pgs.
"Taiwan Application Serial No. 099141065 Response filed Apr. 27, 2015 to Office Action dated Mar. 2, 2015", With the English claims, 9 pgs.
"Taiwanese Application Serial No. 099141065, Office Action dated Feb. 11, 2015", 7 pgs.

* cited by examiner

METHODS FOR PHASE-CHANGE MEMORY ARRAY

TECHNICAL FIELD

Embodiments of the invention are in the field of phase-change memory cells and, in particular, methods of operating phase-change memory arrays.

BACKGROUND

Embedded SRAM and DRAM have problems with non-volatility and soft error rates, while embedded FLASH memories require additional masking layers or processing steps during manufacture, require high-voltage for programming, and have issues with endurance and reliability. Phase-Change Memory (PCM) overcomes the criticality of the above mentioned parameters and exhibits favorable write speeds, small cell sizes, simpler circuitries and a fabrication compatibility with the Complementary Metal-Oxide-Semiconductor (CMOS) process. However, additional improvements are needed in the evolution of the PCM technology.

BRIEF DESCRIPTION DRAWINGS

Figure 4:
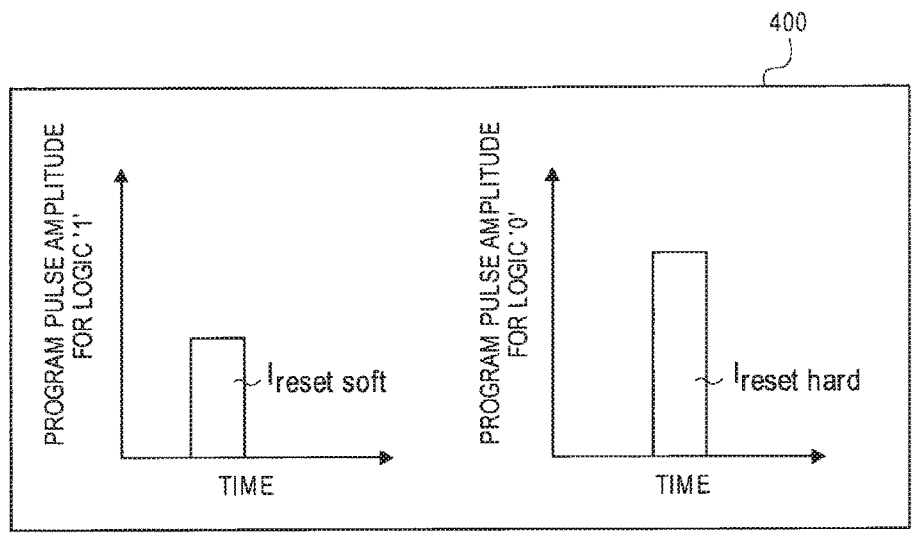

FIG. 4 includes plots of program pulse amplitude for logic "1" as a function of time and program pulse amplitude for logic "0" as a function of time, in accordance with an embodiment of the present invention.

Figure 5:
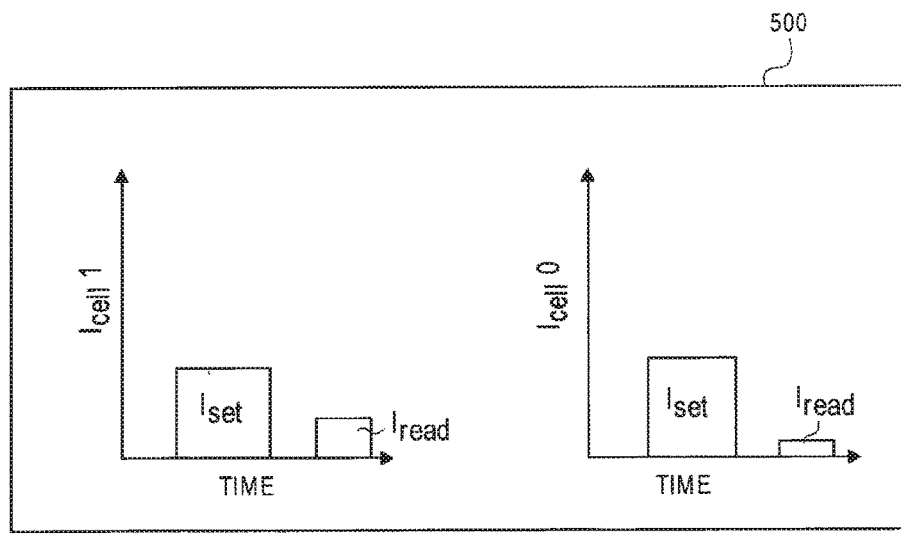

FIG. 5 includes plots of cell current for logic "1" as a function of time and cell current for logic "0" as a function of time, in accordance with an embodiment of the present invention.

Figure 6:
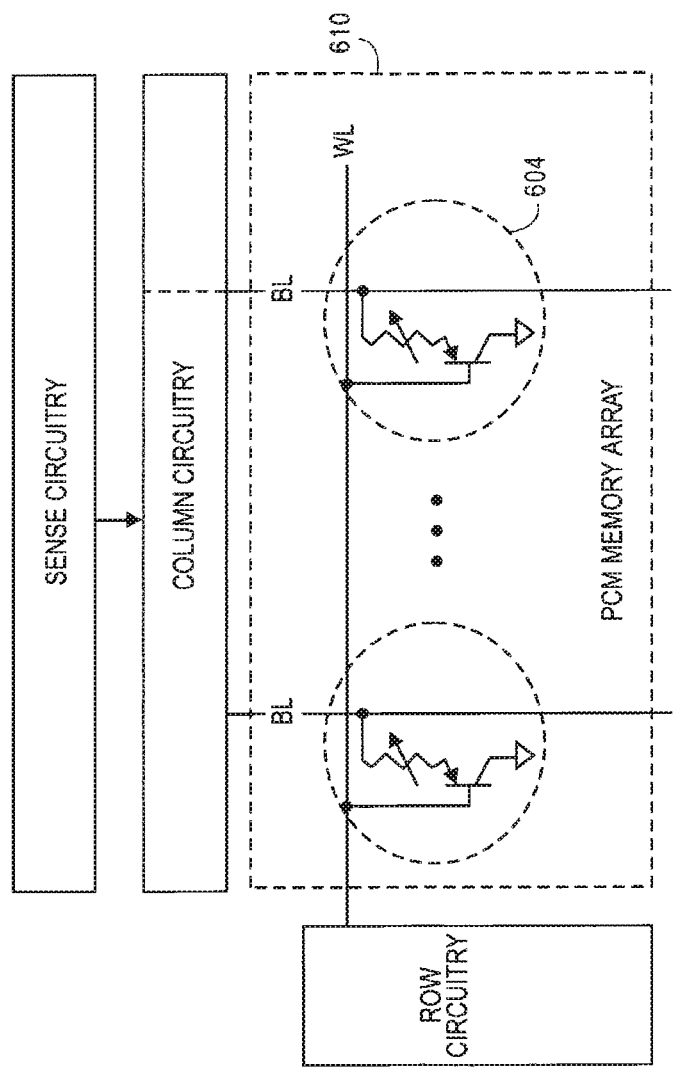

FIG. 6 illustrates an array of phase-change memory cells, in accordance with an embodiment of the present invention.

Figure 7:
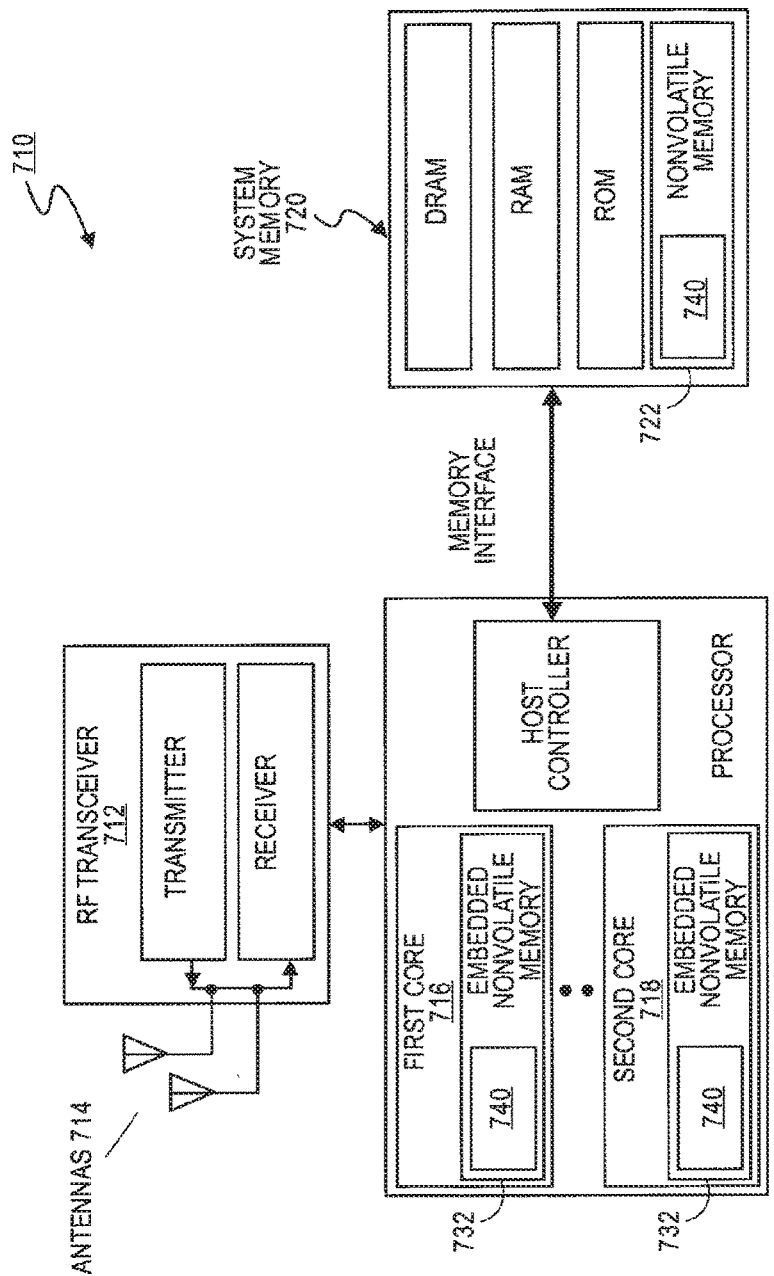

FIG. 7 illustrates a schematic representation of a wireless architecture that incorporates an array of phase-change memory cells, in accordance with an embodiment of the present invention.

Figure 8:
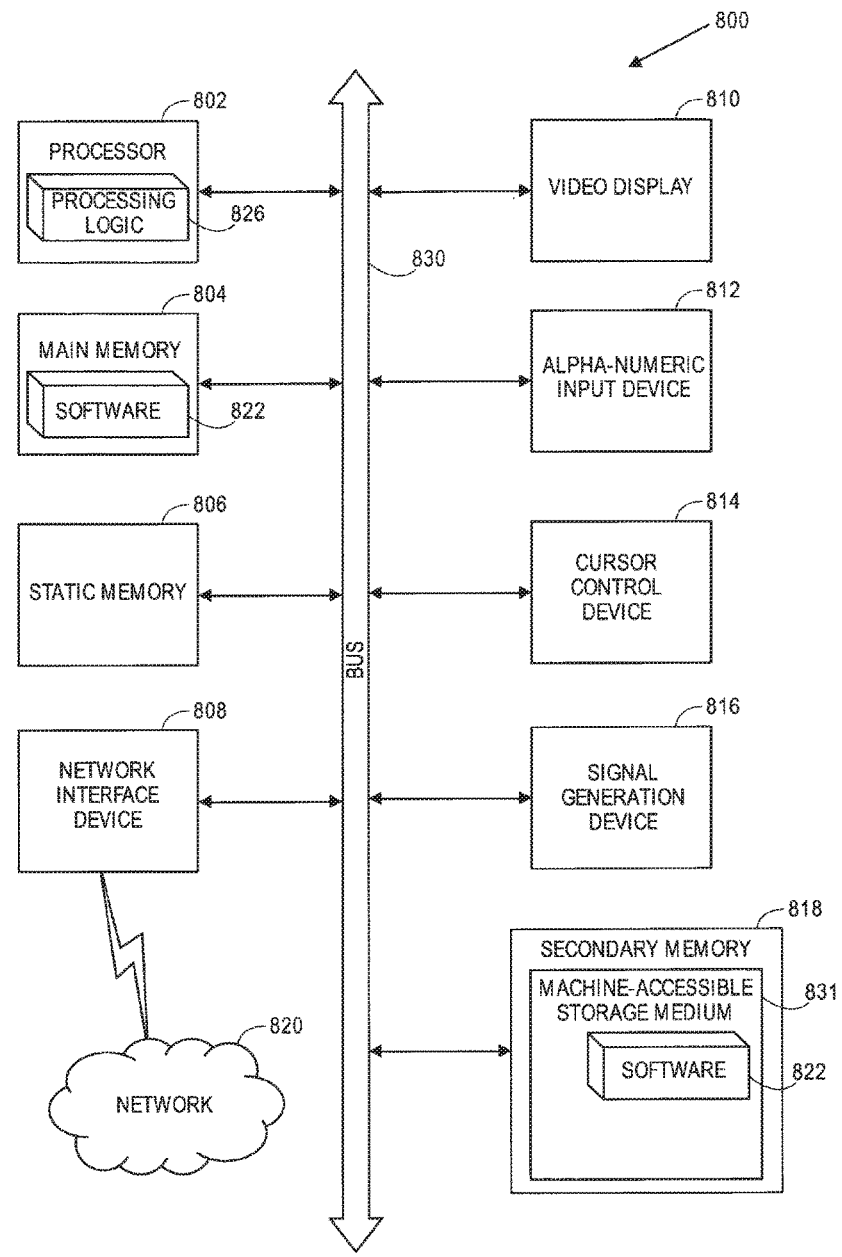

FIG. 8 illustrates a block diagram of an example of a computer system configured for encrypting or decrypting, or for both encrypting and decrypting, a non-volatile memory based on a phase-change memory array, in accordance with an embodiment of the present invention.

Figure 9:
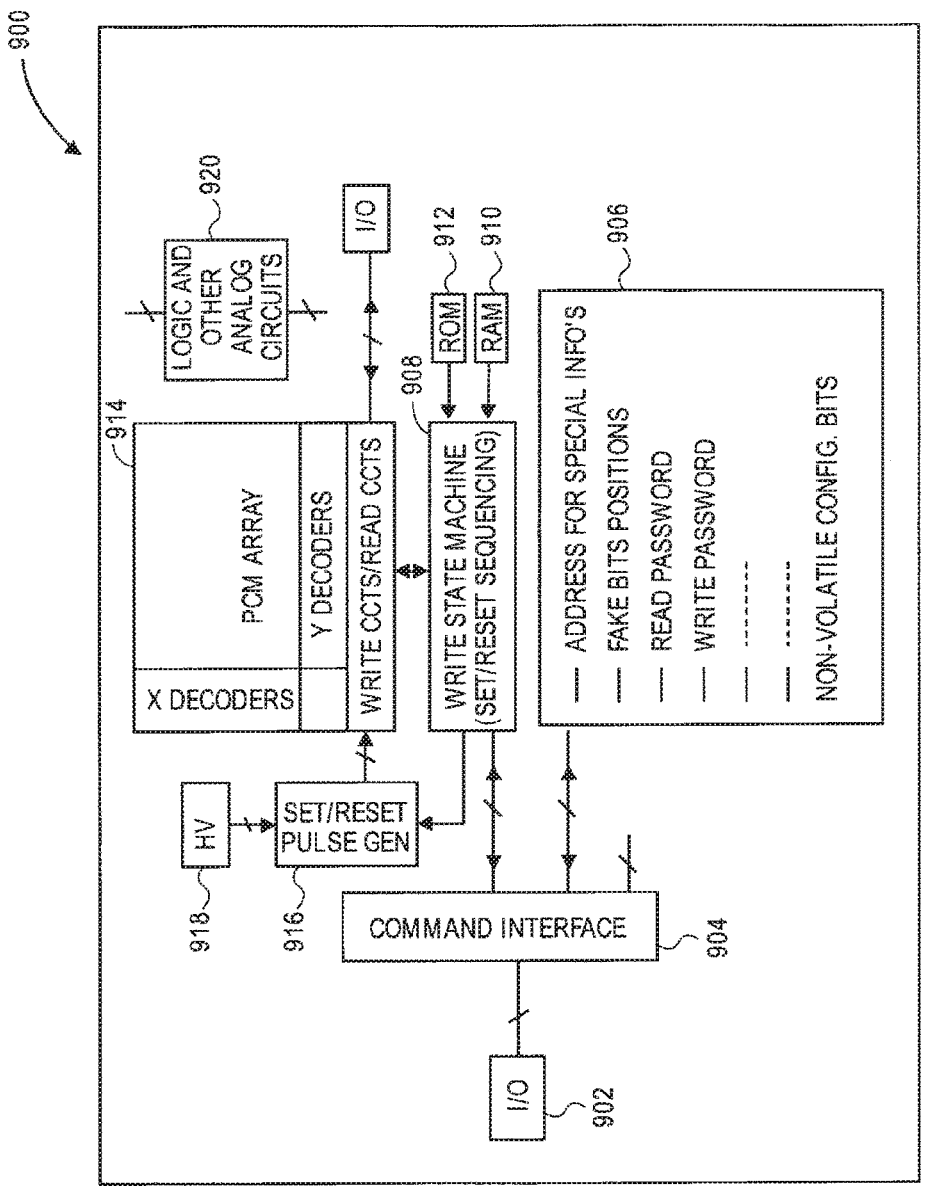

FIG. 9 illustrates a block diagram of an example of a memory architecture configured for encrypting or decrypting, or for both encrypting and decrypting, a non-volatile memory based on a phase-change memory array, in accordance with an embodiment of the present invention.

DETAILED DESCRIPTION

Methods of operating phase-change memory arrays are described herein. In the following description, numerous specific details are set forth, such as specific encryption and decryption approaches, in order to provide a thorough understanding of embodiments of the present invention. It will be apparent to one skilled in the art that embodiments of the present invention may be practiced without these specific details. In other instances, well-known processing operations, such as material processing operations, are not described in detail in order to not unnecessarily obscure embodiments of the present invention. Furthermore, it is to be understood that the various embodiments shown in the Figures are illustrative representations and are not necessarily drawn to scale.

Disclosed herein are methods of operating phase-change memory arrays. In one embodiment, a method of operating a phase-change memory array includes determining a pattern to be written to the phase-change memory array. According to the pattern, two or more proper reset sequences are then executed on the phase-change memory array to write the pattern to the phase-change memory array. In one embodiment, a method of operating a phase-change memory array includes executing a set sequence on the phase-change memory array. A proper read of the phase-change memory array is then performed to obtain a pattern derived from executing the set sequence. In one embodiment, a method of operating a phase-change memory array includes determining a pattern to be written to the phase-change memory array. According to the pattern, two or more proper reset sequences are then executed on the phase-change memory array to write the pattern to the phase-change memory array. A set sequence is then executed on the phase-change memory array. A proper read of the phase-change memory array is then performed to obtain the pattern derived from executing the set sequence.

In accordance with embodiments of the present invention, cryptographic methods based on reset and set operations for phase-change memory (PCM) devices are described. Such method may be based on the capability to differentiate the reset (e.g., to hide information with hard or soft pulses) in order to define proper starting conditions for different set states (e.g., to restore information). In an embodiment, PCM cells are reset with different pulse amplitudes, providing a simpler or harder set ability, once a given set pulse is fixed. A logical value may be associated with a given reset amplitude. If a set is then delivered, this logical value may or may not switch. In an embodiment, such an approach leads to "hidden" information. A "fake" reset, e.g. an all zero write command, may be used in such a case after having sent, to the memory, a given pattern to be hidden. For example, starting from an all-zero pattern, after a set pulse, some of the bits which were initially read as 0s will flip to 1, while others will not, thus unveiling the real data pattern (e.g., (b7, . . . b0)=00000000→10011011). In the example, bit6, bit5, bit2 have seen an harder reset than bit7, 4, 3, 1, 0. In this case, 10011011 is the pattern sent to the memory which has to be hidden. Then, a write All zero command may be sent to the memory or may eventually be executed by the internal state machine without additional commands as a consequence of the request of hiding a pattern. This approach provides a reset sequence of proper magnitude in accordance with the logic state of the bits of the pattern to be hidden and into a hidden pattern equal to 00000000 after completion of the sequence.

Cryptography has become increasingly relevant in many different applications, such as in a Smartcard chip. In accordance with an embodiment of the present invention, in particular to PCM technology and its compatibility with complimentary metal oxide semiconductor (CMOS) embedded processes, PCM is a very likely candidate to substitute FLASH or EEPROM chips in such systems, providing cost effective solutions. In one embodiment, a cryptographic method is based on reset and set operations for PCM devices, as detailed below. PCM cells may be reset with different pulse amplitudes, resulting in a simpler or harder set-ability, once a given set pulse is fixed. This ability may be related to the volume of amorphous material which is obtained after the reset pulsing. For example, in an embodiment, the greater the reset amplitude, the greater the volume of amorphous material and, hence, the more difficult to crystallize. According to this physical property, a logical value may be associated with a given reset amplitude. If a set is then delivered, this logical value may or may not completely switch to a logical 1, e.g. hidden information is generated.

In accordance with an embodiment of the present invention, a cryptographic method is based on the capability to differentiate the reset (e.g., to hide information) in order to define proper starting conditions resulting in different set states (e.g., to restore info) and, ultimately, in different data read. The pattern may be hidden by a reset operation where, e.g., a logical 0, after decryption, is obtained by a hard reset, while a logical 1, after decryption, results from a soft reset. In an embodiment, the pattern before decryption appears like an all-zero 0 pattern. Starting from the all-zero pattern, after a set pulse, some of the bits which initially have been read as 0s will flip to 1s, some others will not, unveiling the real data pattern. The addresses of the patterns may be fixed inside a one-time-programmable memory by the final customer or by the manufacturer, or by both. In an embodiment, an additional data protection level is provided in case a password is somehow cracked and an array content is undesirably read-out. In a specific embodiment, unless a "fake" set, e.g. an "all 1" write command, is not issued, the real content stays hidden inside the pattern. On the other hand, this approach may provide a way to, without digital password, "erase" a word and force a real pattern to appear.

Figure 1:
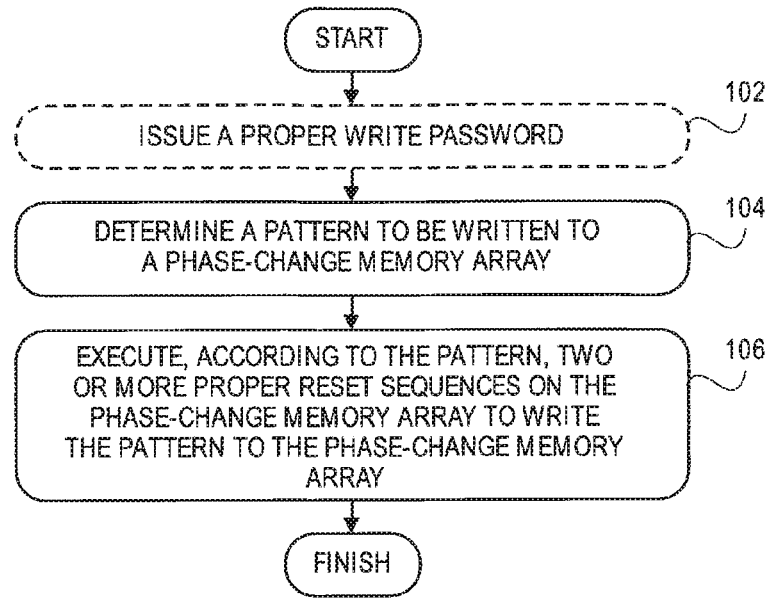
FIG. 1 illustrates a Flowchart representing operations in a method of operating a phase-change memory array, in accordance with an embodiment of the present invention.

A phase-change memory array may be encrypted. For example, FIG. 1 illustrates a Flowchart 100 representing operations in a method of operating a phase-change memory array, in accordance with an embodiment of the present invention.

Referring to operation 104 of Flowchart 100, a method of operating a phase-change memory array includes determining a pattern to be written to the phase-change memory array.

Referring to operation 106 of Flowchart 100, the method of operating a phase-change memory array also includes executing, according to the pattern, two or more proper reset sequences on the phase-change memory array to write the pattern to the phase-change memory array. In accordance with an embodiment of the present invention, a first one of the proper reset sequences has a first amplitude, and a second one of the proper reset sequences has a second amplitude different from the first amplitude. In one embodiment, the first one of the proper reset sequences is to write a logical "0," and the second one of the proper reset sequences is to write a logical "1." In a specific embodiment, writing the pattern to the phase-change memory array is performed by an internal state machine. In an embodiment, the method including operations 104 and 106 is for encrypting the phase-change memory array.

Referring to operation 102 of Flowchart 100, the method of operating a phase-change memory array may optionally, in an embodiment, further include issuing a proper write password, and executing the two or more proper reset sequences includes providing the proper write password. In a specific embodiment, the proper write password is compared with information stored in one-time-programmable memory, e.g. such as a password stored by a manufacturer upon a customer request. In an embodiment, a wrong password or sequence generates a "real" erase of the pattern by selecting a very long set pulse such as, but not limited to, a set sweep or a stair case down.

Figure 2:
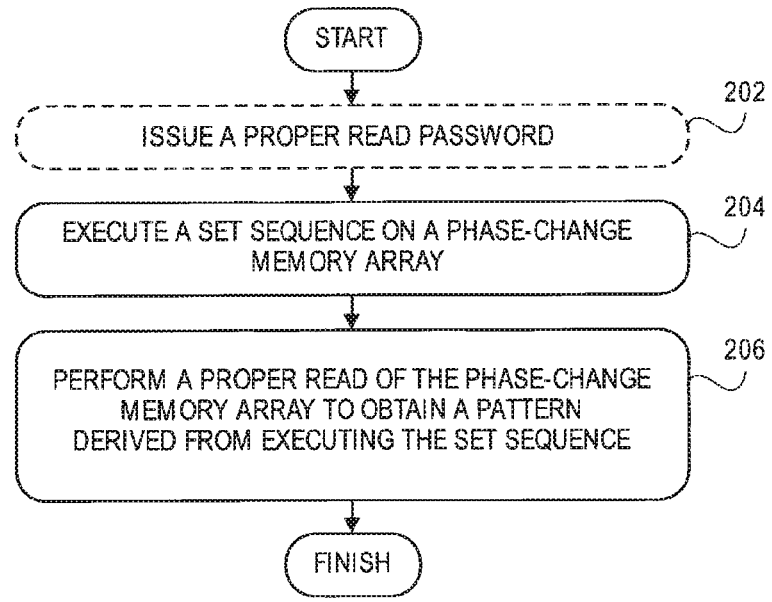
FIG. 2 illustrates a Flowchart representing operations in a method of operating a phase-change memory array, in accordance with an embodiment of the present invention.

A phase-change memory array may be decrypted. For example, FIG. 2 illustrates a Flowchart 200 representing operations in a method of operating a phase-change memory array, in accordance with an embodiment of the present invention.

Referring to operation 204 of Flowchart 200, a method of operating a phase-change memory array includes executing a set sequence on the phase-change memory array.

Referring to operation 206 of Flowchart 200, the method of operating a phase-change memory array also includes performing a proper read of the phase-change memory array to obtain a pattern derived from executing the set sequence. In accordance with an embodiment of the present invention, executing the set sequence on the phase-change memory array includes executing the set sequence with an all-zero pattern target for the phase-change memory array, and the pattern is a non-all-zero pattern. In an embodiment, executing the set sequence on the phase-change memory array includes executing the set sequence with a first pattern target for the phase-change memory array, and the pattern is a second pattern different from the first pattern. In an embodiment, the method includes adjusting an internal read reference to maintain a margin for obtaining the pattern. In a specific embodiment, the internal read reference current is slightly increased. In an embodiment, the method including operations 204 and 206 is for decrypting the phase-change memory array. In an embodiment, a "pattern target" is the pattern stored into the location which can eventually be read before the issuing of the sequence which in turn becomes the "pattern" after the sequence, if eventually read.

Referring to operation 202 of Flowchart 200, the method of operating a phase-change memory array may optionally, in an embodiment, further include issuing a proper read password, wherein performing the proper read includes providing the proper read password. In a specific embodiment, the proper read password is compared with information stored in one-time-programmable memory. In an embodiment, a wrong password or sequence generates a "real" erase of the pattern by selecting a very long set pulse such as, but not limited to, a set sweep or a stair case down. In another optional embodiment, the method further includes, subsequent to performing the proper read, executing two or more proper reset sequences on the phase-change memory array to re-hide the pattern in the phase-change memory array.

Figure 3:
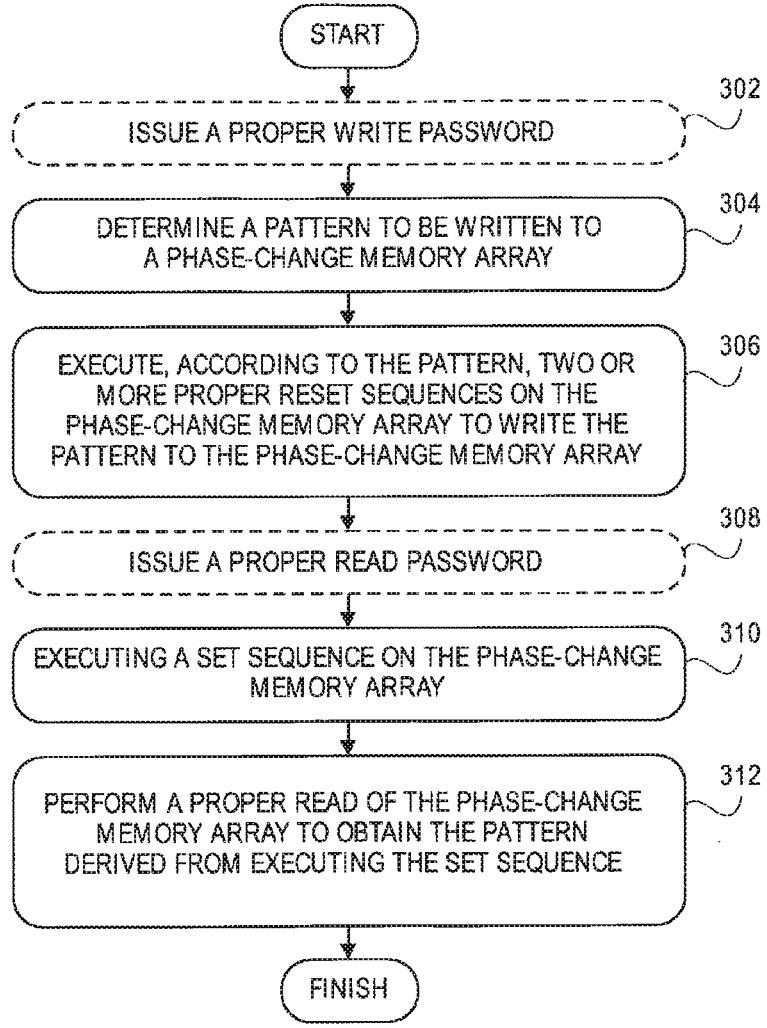
FIG. 3 illustrates a Flowchart representing operations in a method of operating a phase-change memory array, in accordance with an embodiment of the present invention.

A phase-change memory array may be encrypted and later decrypted. For example, FIG. 3 illustrates a Flowchart 300 representing operations in a method of operating a phase-change memory array, in accordance with an embodiment of the present invention.

Referring to operation 304 of Flowchart 300, a method of operating a phase-change memory array includes determining a pattern to be written to the phase-change memory array.

Referring to operation 306 of Flowchart 300, the method of operating a phase-change memory array also includes executing, according to the pattern, two or more proper reset sequences on the phase-change memory array to write the pattern to the phase-change memory array. In accordance with an embodiment of the present invention, a first one of the proper reset sequences has a first amplitude, and a second one of the proper reset sequences has a second amplitude different from the first amplitude. In one embodiment, the first one of the proper reset sequences is to write a logical "0," and the second one of the proper reset sequences is to write a logical "1." In a specific embodiment, writing the pattern to the phase-change memory array is performed by an internal state machine.

Referring to operation 310 of Flowchart 300, a method of operating a phase-change memory array also includes executing a set sequence on the phase-change memory array.

Referring to operation 312 of Flowchart 300, the method of operating a phase-change memory array also includes performing a proper read of the phase-change memory array to obtain the pattern derived from executing the set sequence. In accordance with an embodiment of the present invention, executing the set sequence on the phase-change memory array includes executing the set sequence with an all-zero pattern target for the phase-change memory array, and the pattern is a non-all-zero pattern. In an embodiment, executing the set sequence on the phase-change memory array includes executing the set sequence with a first pattern target for the phase-change memory array, and the pattern is a second pattern different from the first pattern. In an embodiment, the method includes adjusting an internal read reference to maintain a margin for obtaining the pattern. In a specific embodiment, the internal read reference current is slightly increased.

Referring to operation 302 of Flowchart 300, the method of operating a phase-change memory array may optionally, in an embodiment, further include issuing a proper write password, and executing the two or more proper reset sequences includes providing the proper write password. In a specific embodiment, the proper write password is compared with information stored in one-time-programmable memory, e.g. such as a password stored by a manufacturer upon a customer request. Furthermore, referring to operation 308 of Flowchart 300, the method of operating a phase-change memory array may optionally, in an embodiment, further include issuing a proper read password, wherein performing the proper read includes providing the proper read password. In a specific embodiment, the proper read password is compared with information stored in one-time-programmable memory. In an embodiment, a wrong password (proper read password, proper write password, or both) or sequence generates a "real" erase of the pattern by selecting a very long set pulse such as, but not limited to, a set sweep or a stair case down. In another optional embodiment, the method further includes, subsequent to performing the proper read, executing two or more proper reset sequences on the phase-change memory array to re-hide the pattern in the phase-change memory array.

In one embodiment, the pattern is composed by real information bits which contain sensitive information (whatever its nature) and by fake bits with a state and with read and program operations that do not necessarily matter. Information bits and fake bits are merged inside the same logical nibbles, bytes, words, double words, long words or any of the minimum or maximum logic packets of bits which are manipulated during the system operations. In this embodiment, the reset sequences and the set sequences may be executed only on the information bits while fake bits are programmed with random pattern or with some given pattern. In such a case, the position of the fake bits (or complementary to the position of the information bits) is written into non-volatile registers (e.g., one-time-programmable non-volatile registers) which can be read by the machine executing the sequencing in response to proper commands issued by the system to the memory as well as by the system processor upon the issuing of proper commands and passwords. The expected target pattern before decryption may be then different than an all zero. Also, the target pattern to be written may contain some real ones and zeros and some fake ones and zeros. An internal state machine will select the information bits according to the configuration bits and will pulse with the proper reset or set sequence, such as the reset or set sequences described herein, according to the particular operation requested by the host. Meanwhile, the fake bits will be handled randomly with conventional program techniques.

FIG. 4 includes plots 400 of program pulse amplitude for logic "1" as a function of time and program pulse amplitude for logic "0" as a function of time, in accordance with an embodiment of the present invention.

Referring to FIG. 4, the plot on the left side represents program pulse amplitude for logic "1" as a function of time. A soft reset (Ireset soft) is performed, consistent with a less resistive phase-change memory cell. The plot on the right side represents program pulse amplitude for logic "0" as a function of time. A hard reset (Ireset hard) is performed, consistent with a more resistive phase-change memory cell.

FIG. 5 includes plots 500 of cell current for logic "1" as a function of time and cell current for logic "0" as a function of time, in accordance with an embodiment of the present invention.

Referring to FIG. 5, the plot on the left side represents cell current for logic "1" as a function of time. A relatively high current read (head) is sunk under given read bias conditions, relative to the set current (Iset). The plot on the right side represents cell current for logic "0" as a function of time. A relatively low current read (head) is sunk under given read bias conditions, relative to the set current (Iset). Iset is selected to be sufficient to set a less resistive phase-change memory cell, but not a more resistive phase-change memory cell.

In an aspect of the present invention, a phase-change memory cell array includes memory cells that are composed of a storage material in combination with a selector device. For example, FIG. 6 illustrates an array 610 of phase-change memory cells 604, in accordance with an embodiment of the present invention. In an embodiment, array 610 includes phase-change memory cells composed of alloys of elements of group VI of the periodic table, elements such as Te or Se that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. Array 610 includes phase-change memory cells each having a selector device and a memory element. Although the array is illustrated with bipolar selector devices, it should be noted that alternative embodiments may use CMOS selector devices or diodes to identify and selectively change the electrical properties (e.g. resistance, capacitance, etc.) of the chalcogenide material through the application of energy such as, for example, heat, light, voltage potential, or electrical current. The chalcogenic material may be electrically switched between different states intermediate between the amorphous and the crystalline states, thereby giving rise to a multilevel storing capability. To alter the state or phase of the memory material, this embodiment illustrates a programming voltage potential that is greater than the threshold voltage of the memory select device that may be applied to the memory cell. An electrical current flows through the memory material and generates heat that changes the electrical characteristic and alters the memory state or phase of the memory material.

By way of example, heating the phase-change material to a temperature above 900° C. in a write operation places the phase change material above its melting temperature ($T_M$). Then, a rapid cooling places the phase-change material in the amorphous state that is referred to as a reset state where stored data may have a "0" value. Taking $Ge_2Sb_2Te_5$ as an example, the time between achieving the melting temperature Tm and quenching after the local heating to achieve the amorphous phase may be less than 50 nanoseconds. On the other hand, to program a memory cell from reset to set, the local temperature is raised higher than the crystallization temperature (Tx) for a time longer than 50 nanoseconds (for $Ge_2Sb_2Te_5$) to allow complete crystallization. The phase-change material in the crystalline form is referred to as a set state and stored data may have a "1" value. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize. In a read operation, the bit line (BL) and word line (WL) are selected and an external voltage bias is provided to the selected memory cell. To read a chalcogenide memory device, the current difference between the cell current and a given reference current resulting from the different device resistance is sensed. It is then determined whether data stored in the selected memory cell is a "1" or "0" based on that current difference change caused by a resistance of the phase-change material of the selected memory cell. It is to be appreciated that the association of reset and set with amorphous and crystalline states, respectively, is a convention and that at least an opposite convention may be adopted. Also, other methods for reading the resistance the state) may be implemented, such as forcing a current and reading a voltage or pre-charging a capacitance and discharging it thru the cell. The above described approaches are not necessarily dependent on the way the data is read.

In another aspect of the present invention, FIG. 7 illustrates a schematic representation of a wireless architecture that incorporates an array of phase-change memory cells, in accordance with an embodiment of the present invention. The wireless architecture embodiment illustrated in FIG. 7 shows a communications device 710. It should be noted that the present invention is not limited to wireless communication embodiments and other, non-wireless applications may be used in conjunction with embodiments of the present invention (such as computing, data storage, consumer, automotive etc). As shown in this wireless embodiment, communications device 710 includes one or more antenna structures 714 to allow radios to communicate with other over-the-air communication devices. As such, communications device 710 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems co-located in the same platform of communications device 710 provide the capability of communicating with different frequency bands in an RF/location space with other devices in a network.

It should be understood that the scope of the present invention is not limited by the types of, the number of, or the frequency of the communication protocols that may be used by communications device 710. However, by way of example, the embodiment illustrates the coupling of antenna structure 714 to a transceiver 712 to accommodate modulation/demodulation. In general, analog front end transceiver 712 may be a stand-alone Radio Frequency (RF) discrete or integrated analog circuit, or transceiver 712 may be embedded with a processor having one or more processor cores 716 and 718. The multiple cores allow processing workloads to be shared across the cores and handle baseband functions and application functions. An interface may be used to provide communication or information between the processor and the memory storage in a system memory 720. Although the scope of the present invention is not limited in this respect, the interface may include serial and/or parallel buses to share information along with control signal lines to be used to provide handshaking between the processor and system memory 720.

The system memory 720 may optionally be used to store instructions that are executed by the processor during the operation of wireless communication device 710, and may be used to store user data such as the conditions for when a message is to be transmitted by wireless communication device 710 or the actual data to be transmitted. For example, the instructions stored in system memory 720 may be used to perform wireless communications, provide security functionality for communication device 710, user functionality such as calendaring, email, internet browsing, etc. System memory 720 may be provided by one or more different types of memory and may include both volatile and a nonvolatile memory 722 having a phase change material. Nonvolatile memory 722 may be referred to as a Phase Change Memory (PCM), Phase-Change Random Access Memory (PRAM or PCRAM), Ovonic Unified Memory (OUM) or Chalcogenide Random Access Memory (C-RAM). The volatile and nonvolatile memories may be combined in a stacking process to reduce the footprint on a hoard, packaged separately, or placed in a multi-chip package with the memory component placed on top of the processor. The embodiment also illustrates that one or more of the processor cores may be embedded with nonvolatile memory 732.

In an embodiment, the present invention is provided as a computer program product, or software product, that includes a machine-readable medium having stored thereon instructions, which is used to program a computer system (or other electronic devices) to perform a process according to embodiments of the present invention. A machine-readable medium may include any mechanism for storing or transmitting information in a form readable by a machine (e.g., a computer). For example, in an embodiment, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc. In an embodiment, use of the term "computer-implemented" herein means processor-implemented. In one embodiment, one of the methods described herein is implemented in a portable device, such as a cellular phone, which does not have a computer per se but does have a processor.

FIG. 8 illustrates a diagrammatic representation of a machine in the form of a computer system 800 within which a set of instructions, for causing the machine to perform any one or more of the methodologies discussed herein, is executed. For example, in accordance with an embodiment of the present invention, FIG. 8 illustrates a block diagram of an example of a computer system configured for encrypting or decrypting, or both, a phase-change memory array. In alternative embodiments, the machine is connected (e.g., networked) to other machines in a Local Area Network (LAN), an intranet, an extranet, or the Internet. In an embodiment, the machine operates in the capacity of a server or a client machine in a client-server network environment, or as a peer machine in a peer-to-peer (or distributed) network environment. In an embodiment, the machine is a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers or processors) that individually or jointly execute a set (or multiple sets) of instructions to perform any one or more of the methodologies discussed herein.

The example of a computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, in an embodiment, the processor 802 is a complex instruction set computing (CISC) microprocessor, reduced instruction set computing (RISC) microprocessor, very long instruction word (VLIW) microprocessor, processor implementing other instruction sets, or processors implementing a combination of instruction sets. In one embodiment, processor 802 is one or more special-purpose processing devices such as an application specific integrated circuit (ASIC), a field programmable gate array (FPGA), a digital signal processor (DSP), network processor, or the like. Processor 802 executes the processing logic 526 for performing the operations discussed herein.

In an embodiment, the computer system 800 further includes a network interface device 808. In one embodiment, the computer system 500 also includes a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

In an embodiment, the secondary memory 818 includes a machine-accessible storage medium (or more specifically a computer-readable storage medium) 831 on which is stored one or more sets of instructions (e.g., software 822) embodying any one or more of the methodologies or functions described herein. In an embodiment, the software 822 resides, completely or at least partially, within the main memory 804 or within the processor 802 during execution thereof by the computer system 800, the main memory 804 and the processor 802 also constituting machine-readable storage media. In one embodiment, the software 822 is further transmitted or received over a network 820 via the network interface device 808.

While the machine-accessible storage medium 831 is shown in an embodiment to be a single medium, the term "machine-readable storage medium" should be taken to include a single medium or multiple media (e.g., a centralized or distributed database, or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of embodiments of the present invention. The term "machine-readable storage medium" shall accordingly be taken to include, but not be limited to, solid-state memories, and optical and magnetic media.

FIG. 9 illustrates a block diagram of an example of a memory architecture configured for encrypting or decrypting, or for both encrypting and decrypting, a non-volatile memory based on a phase-change memory array, in accordance with an embodiment of the present invention.

Referring to FIG. 9, a memory architecture 900 includes an I/O 902 coupled with a command interface 904. Command interface 904 is coupled with a block 906 including information such as, but not limited to addresses for special information, fake bit positions, read passwords, write passwords, and non-volatile configuration bits. Command interface 904 is also coupled to a write state machine 908 for set and reset sequencing. A RAM 910 and a ROM 912 are coupled with write state machine 908. Write state machine 908 is coupled with a set and reset pulse generator 916, which is coupled to a high voltage generators (HV) 918. Write state machine 908 is also coupled to a block. 914 which includes a phase-change memory array, X decoders, Y decoders, write circuits and read circuits. Write state machine 908 is also coupled with an additional I/O. Other features may be included in memory architecture 900, such as logic and other analog circuits 920.

Thus, methods of operating phase-change memory arrays have been disclosed. In accordance with an embodiment of the present invention, a method of operating a phase-change memory array includes determining a pattern to be written to the phase-change memory array. According to the pattern, two or more proper reset sequences are then executed on the phase-change memory array to write the pattern to the phase-change memory array. A set sequence is then executed on the phase-change memory array. A proper read of the phase-change memory array is then performed to obtain the pattern derived from executing the set sequence. In one embodiment, the method further includes issuing a proper write password, wherein executing the two or more proper reset sequences includes providing the proper write password. In one embodiment, the method further includes issuing a proper read password, wherein performing the proper read includes providing the proper read password. Useful information such as special addresses, passwords or information bits position may be stored into or retrieved by some internal non volatile registers, such as one-time programmable bits.

What is claimed:

1. A method of operating a memory structure, comprising:
   determining a pattern to be written to the memory structure, the memory structure comprising multiple memory cells having a storage element including a chalcogenide material, the pattern comprising both real data bits representing data to be stored and fake data bits having a state that is unimportant to the data to be stored;
   writing the pattern to a group of the memory cells; and prior to writing the data bits and fake data bits to the group of memory cells, receiving a password associated with a memory operation, comparing the password to a password stored in the memory structure, determining a match between the received write password and the stored password, and in response to determining the match, performing at least two reset operations on at least the group of memory cells, wherein each reset operation comprises providing at least one of, one or more hard reset pulses or one or more soft reset pulses, to the group of memory cells.

2. The method of claim 1, wherein the multiple memory cells are variable resistance memory cells.

3. The method of claim 1, wherein the fake data bits are incorporated in a same logic packet as the real data bits.

4. The method of claim 3, wherein the logic packets are selected from at least one packet type including packet types of nibbles, bytes, words, double words, and long words.

5. The method of claim 1, wherein wherein hard reset pulses have a magnitude greater than that of soft reset pulses.

6. The method of claim 1, wherein the reset operation comprises providing one or more hard reset pulses to at least the group of memory cells, and wherein the one or more hard reset pulses place the group of memory cells in a first logic state.

7. The method of claim 1, wherein the reset operation comprises providing one or more soft reset pulses to at least the group of memory cells, and wherein the one or more soft reset pulses place the group of memory cells in a second logic state.

8. The method of claim 2, further comprising, prior to writing the pattern to the group of memory cells, placing the memory cells of the group in a known logic state.

9. The method of claim 6, wherein the first logic state is a logical "0".

10. The method of claim 7, wherein the second logic state is a logical "1".

11. The method of claim 1, further comprising comparing the password with information stored in a programmable memory to verify a validity of the password relative to the associated memory operation.

12. A method of operating a memory structure, comprising:

determining a pattern to be written to the memory structure, the memory structure comprising multiple memory cells having a storage element including a chalcogenide material, the pattern comprising both real data bits representing data to be stored and fake data bits having a state that is unimportant to the data to be stored;

writing the pattern to a group of the memory cells;

receiving a password associated with a memory operation;

comparing the password to a password stored in the memory structure;

determining a non-match between the received password and the stored password; and in response to determining the non-match, performing an erase operation on at least the group of memory cells.

13. The method of claim 12, wherein performing the erase operation comprises applying a set pulse to at least the group of memory cells.

14. A system, comprising:

a memory array including multiple memory cells including storage elements comprising a chalcogenide material;

a memory block separate from the memory array, the memory block configured to include system information including passwords for memory operations on the memory array;

one or more processors coupled to the memory array configured to, determine a pattern to be written to a group of memory cells of the memory array, the pattern comprising both real data bits having a state representative of data to be stored, and fake data bits having a state that is unimportant to the data of the real data bits, compare a received password associated with a requested memory operation to a password stored in the memory block to determine whether the received password matches the stored password; and in response the determination, performing one of multiple possible operations on at least the group of memory cells; and an internal state machine coupled to the memory array and configured to write the pattern to the group of memory cells of memory array.

15. The system of claim 14, wherein the multiple memory cells storage elements comprising a chalcogenide material are variable resistance memory cells.

16. The system of claim 14, wherein the internal state machine is further to perform set and reset sequencing of the memory array.

17. The system of claim 14, wherein the writing of a pattern comprising real data bits and fake data bits operates to encrypt the data of the real data bits.

18. The system of claim 14, wherein the multiple possible operations comprise:

resetting at least a portion of the memory cells of the memory array to a known logic state; and erasing at least a portion of the memory cells of the memory array.

* * * * *